United States Patent [19]

Kraushaar

[11] 4,055,749

[45] Oct. 25, 1977

[54] ELECTRONIC HEBREW CALENDAR AND DATE CALCULATOR

[76] Inventor: Jonathan Moses Kraushaar, Annandale, Va. 22003

[21] Appl. No.: 745,243

[22] Filed: Nov. 26, 1976

[51] Int. Cl.[2] ........................ H03K 21/36; G09D 3/00

[52] U.S. Cl. ........................ 235/92 PE; 235/92 CC; 235/92 T; 235/92 R; 40/107

[58] Field of Search ............ 235/92 CC, 92 T, 92 PE, 235/92 ME, 92 DM, 92 DE; 40/107; 58/4 A

[56] References Cited

U.S. PATENT DOCUMENTS

| | | | |
|---|---|---|---|
| 3,272,970 | 9/1966 | Laycak et al. | 235/92 ME |
| 3,581,066 | 5/1971 | Maure et al. | 235/92 CC |
| 3,584,201 | 6/1971 | Pons | 235/92 ME |
| 3,674,991 | 7/1972 | Isvetkov et al. | 235/92 CC |
| 3,764,781 | 10/1973 | Kreithen et al. | 235/92 PE |
| 3,797,222 | 3/1974 | Kato | 40/107 |
| 3,916,172 | 10/1975 | Engle | 235/92 DM |

*Primary Examiner*—Joseph M. Thesz

[57] ABSTRACT

An electronic calendar device capable of maintaining and displaying the date of the Hebrew, sometimes referred to as the Jewish, calendar which is based on the lunar cycle. In addition it is capable of computing the day of the week a certain Hebrew date will fall and corresponding Hebrew/Gregorian dates. The device corrects for all regular and irregular variations of the Hebrew calendar over a period of 10 years using a simple card or chip containing only prewired connections. Also displayed are the days of the week and the calendar year. The device requires a one pulse per day input which is available from standard electronic clock circuit chips in addition to the setting and computing input clock rates to be described.

12 Claims, 9 Drawing Figures

ELECTRONIC HEBREW CALENDAR AND DATE CALCULATOR

BACKGROUND OF THE INVENTION

The Hebrew calendar (also referred to as the Jewish calendar) is based of the lunar cycle and governs many aspects of Jewish religious life, including the occurrences of religious holidays, observance of the anniversary of a death, etc. It has been used over the centuries by Jews throughout the world for such purposes. As a lunar calendar it is quite different and substantially more complex than the standard Gregorian calendar; however, the end result is that its months track the cycles of the moon with surprising accuracy over many millenia and maintain a proper relationship to the solar year and its seasons. Further, it is set up to prohibit the occurence of major holidays on certain days of the week. A relatively fixed relationship with the Gregorian calander is maintained at the end of each 19 year cycle. Study of this calandar and its intricacies has presented a challenge to Hebraic scholars and mathematicians alike, and as such poses some interesting problems for implementation into an electronic device. To assist in the explanation of the salient features of this calendar and the invention, several tables which can be found in the detailed description and specification have been included.

The Hebrew calendar consists of 12 regular months listed in Table I and a leap month which occurs only on the 3rd, 6th, 8th, 11th, 14th, 17th and 19th years of the basic 19 year cycle. In addition, 3 other months can vary in their number of days (between 29 and 30) as shown in Table II. All the remaining months are fixed at either 29 or 30 days in an alternating pattern. Careful study of the result of the regular and irregular yearly variations reveals that only six basic year types are possible, containing 353, 354, 355, 383, 384 or 385 days. These year types are indicated for the years 5736–5771 (1975–2011) in Table III. To establish a given year type, one must specify whether the year in question is a leap year and the number of days in the three months whose length fluctuates from year to year. Further analysis shows one of these months (Adar I) to contain 30 days only when there is a leap year and the leap month is added. The remaining 2 months, Heshvan and Kislev (shown in Table II) both vary between 29 and 30 days, but any true pattern in this variation would be so long that it cannot be seen in a period of as much as 200 years. (An almost exact cycle occurs every 247 (13×19) years, but this too is not precise.) This is because of a number of complex rules governing which day of the week the next new year must fall and the precise time of day for the new moon of the new year. The details of these rules will not be discussed here.

The minor irregular variations in the length of Heshvan and Kislev make an electronic implementation of this calendar based on a simple cyclical system virtually impossible. Further, the implementation described herein represents a significant advantage of cost and compactness over a computer system imcorporating the complex rules mentioned above. The present invention is a novel means for automatically tracking and displaying the Hebrew (Jewish) calendar date for a 10 year period in view of the intricacies described and in view of simplicity and reasonable cost. The salient features of this invention may also be applied to other calendars where there are complex or non-cyclical irregularities.

The invention shown herein can be used directly to display the Hebrew date and day of the week, or in conjunction with an electronic Gregorian calendar device to compute corresponding calendar dates for the two calendars. It can also be used to compute the day of the week for a specified Hebrew date. These applications are illustrated in FIG. 3. Because of the extreme accuracy with which the Hebrew calendar tracks the lunar cycle it could also be used to display the phases of the moon. Electronic and mechanical means have been developed to track the relatively minor variations in the secular (Gregorian) calendar and to display the date; however, there appears to have been no attempt to implement an electronic device to enable the automatic display of the Hebrew date from this calendar. Further, the use of prewired memory cards and appropriate gating enable the device to track irregular calendar variations over a ten year period. This is a novel approach which facilitates inexpensive conversion of the calendar for a new 10-year period, while minimizing the cost and complexity of the device.

SUMMARY OF THE INVENTION

The important part of this invention is the discovery of an electronic means by which the date of the Hebrew (Jewish) calendar could be continuously displayed and tracked over any 10-year or other defined period of the presence of subtle yearly variations in several of its months. The problem is solved by using a novel gating arrangement with facility of "preprogramming" by the insertion of simple hard-wired connecting chips or cards. This permits continued accuracy over 10 years with a simplified form of memory.

The device operates through the interfacing of 3 separate specially designed counters for the month, day and year, in conjunction with logic elements, and an associated prewired card. Appropriate gating is used to detect when the 29th or 30th day of the given month is reached. If the month register indicates a 29-day month, the day counter is reset to one of the 30th day. If a 30-day month is indicated, the day counter is reset to one on the 31st day. Months which may have either 29 or 30 l days (depending upon the year type) require both the input of the year counter and the prewired memory card of chip to determine when to reset the day counter. A reset condition of the day counter is accomplished by a pulse to the month shift register (counter) which advances the month indication. The year counter is advanced when the new year month is first displayed.

When operating as a calendar display device, it is driven by a 1 pulse day per source (such as the AM/PM output of standard integrated clock circuit chips). When operated as a date computer, or when operated in the setting mode, a one pulse per second and a variable pluse rate input is used. By using a suitable switching arrangement, these inputs are applied to the Hebrew calendar, a Gregorian calendar and a day of the week counter separately or in unison. By setting the calendars and day of the week counter to a known combination of dates, any further date combination can be calculated by driving the calendars with the variable pulse rate input.

DETAILED DESCRIPTION OF THE INVENTION

Figure 1:
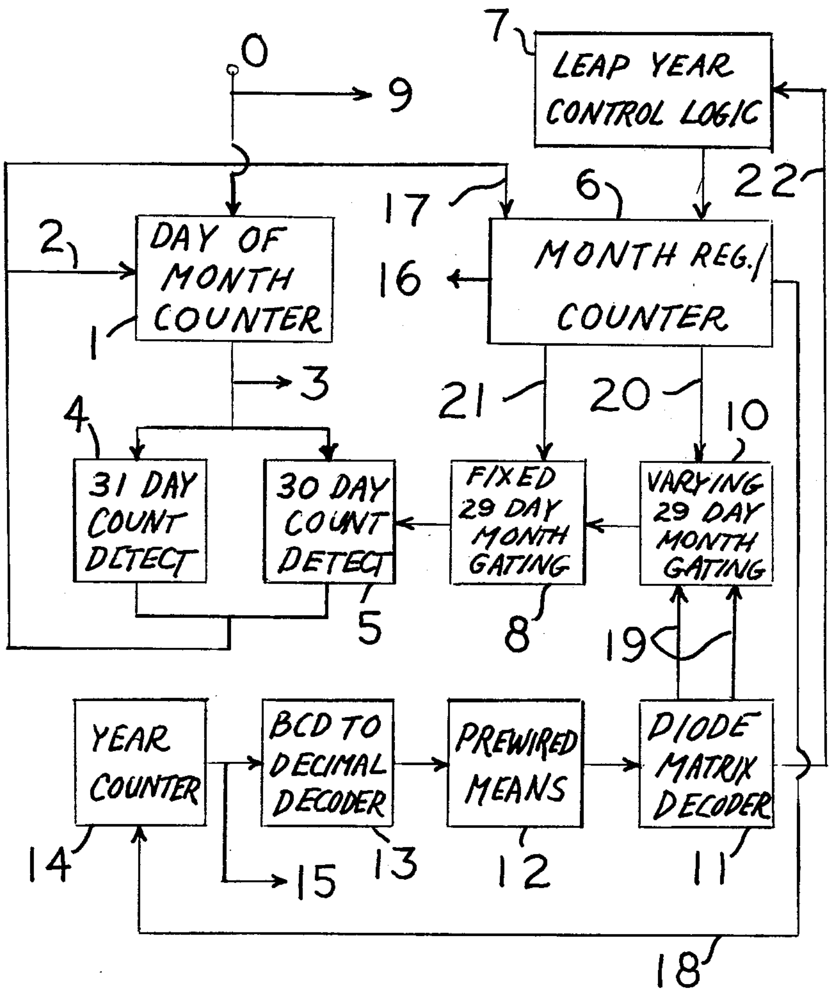
FIG. 1 is a block diagram showing the operation of the electronic Hebrew calendar.

The block diagram of FIG. 1 illustrates the basic principles of operation of the invention. In order to facilitate understanding of the details of operation and organization of each component part, a numbering system consisting of either one number or two numbers separated by a decimal point has been used. All component parts of the block numbered 1 in FIG. 5, for example, contain the prefix "1" followed by a decimal and second number which indicates a specific part or connection associated with that block. Thus, reference to FIG. 1 and a second referenced figure should facilitate understanding of this specification. It may be useful at this point to note the fact that a NAND gate with inverted inputs is equivalent to an OR representation (De Morgan's Law). Note also that an "H" is used to indicate a high logic level and "L" a low logic level. Five tables shown below are referenced in this description to clarify and augment certain parts of the specification.

The operation of the invention is summarized by the block diagram of FIG. 1 which will be described first to give a picture of the invention as a whole. Set, compare or operate inputs 0 are connected to the day of the month counter 1 through appropriate switching to be discussed. Gates 4 and 5 detect the presence of 31 or 30 day counts on the day counter 1 in order to reset it through wire 2 after the 30th or 29th day of the month respectively. The output leads of this counter are also connected to a display 3 with its associated logic. (See FIG. 1.)

Table I

| Month | # days | Corresponding Months |
|---|---|---|
| TISHREI | 30 | September/October |
| HESHVAN | 29/30 | October/November |
| KISLEV | 29/30 | November/December |
| TEVET | 29 | December/January |
| SHEVAT | 30 | January/February |
| ADAR I | 29/30 | February/March |
| ADAR II | 29 | February/March |
| NISAN | 30 | March/April |
| IYAR | 29 | April/May |
| SIVAN | 30 | May/June |
| TAMMUZ | 29 | June/July |
| AV | 30 | July/August |
| ELUL | 29 | August/September |

Table II

| | Year Types and Varying Months | | | | | |
|---|---|---|---|---|---|---|
| Yr. type | 1 | 2 | 3 | 4 | 5 | 6 |
| HESHVAN | 29 | 29 | 30 | 30 | 29 | 29 |
| KISLEV | 29 | 30 | 30 | 30 | 29 | 30 |
| ADAR I | 30 | 29 | 29 | 30 | 29 | 30 |
| ADAR II | 29 | — | — | 29 | — | 29 |
| Total days | 383 | 354 | 355 | 385 | 353 | 384 |

Table III

| Year | Year Type | # Days in Year | Year in Leap Year Cycle |
|---|---|---|---|
| 5736 | 4 | 385* | 17 (1975-6) |
| 5737 | 5 | 353 | 18 |
| 5738 | 6 | 384* | 19 |
| 5739 | 3 | 355 | 1 |
| 5740 | 3 | 355 | 2 |
| 5741 | 1 | 383* | 3 |
| 5742 | 2 | 354 | 4 |
| 5743 | 3 | 355 | 5 |
| 5744 | 4 | 385* | 6 |
| 5745 | 2 | 354 | 7 |
| 5746 | 1 | 383* | 8 |
| 5747 | 3 | 355 | 9 |
| 5748 | 2 | 354 | 10 |
| 5749 | 1 | 383* | 11 |
| 5750 | 3 | 355 | 12 |
| 5751 | 2 | 354 | 13 |
| 5752 | 4 | 385* | 14 |
| 5753 | 5 | 353 | 15 |
| 5754 | 3 | 355 | 16 |
| 5755 | 6 | 384* | 17 |
| 5756 | 3 | 355 | 18 |
| 5757 | 1 | 383* | 19 |
| 5758 | 2 | 354 | 1 |
| 5759 | 3 | 355 | 2 |
| 5760 | 4 | 385* | 3 |
| 5761 | 5 | 353 | 4 |
| 5762 | 2 | 354 | 4 |
| 5763 | 4 | 385* | 6 |
| 5764 | 3 | 355 | 7 |
| 5765 | 1 | 383* | 8 |
| 5766 | 2 | 354 | 9 |
| 5767 | 3 | 355 | 10 |
| 5768 | 1 | 383* | 11 |
| 5769 | 2 | 354 | 12 |
| 5770 | 3 | 355 | 13 |
| 5771 | 4 | 385* | 14 |

*Leap years

Further examining FIG. 1, one sees that the month shift register 6 is clocked through wire 17 by the pulse on wire 2 which resets the day counter 1. The 29 day month outputs of the register 6 are gated together through gate 8 to provide a reset control to the day counter 1 through gate 5 so that it can differentiate in its count between 29 and 30 day months. Month outputs of those months which vary between 29 and 30 days are fed through wires 20 into gates 10 accompanied by the required inputs from the diode matrix decoder 11. When such months contain 29 days they are treated as the fixed 29 day months and the output of gate 10 controls gate 8 described above. The diode matrix decoder 11 also controls the leap year logic circuit 7 which adjusts the month shift register 6 between 12 and 13 bits length. The month register has a display 16 consisting of individual LED lamps for each month.

Figure 4:
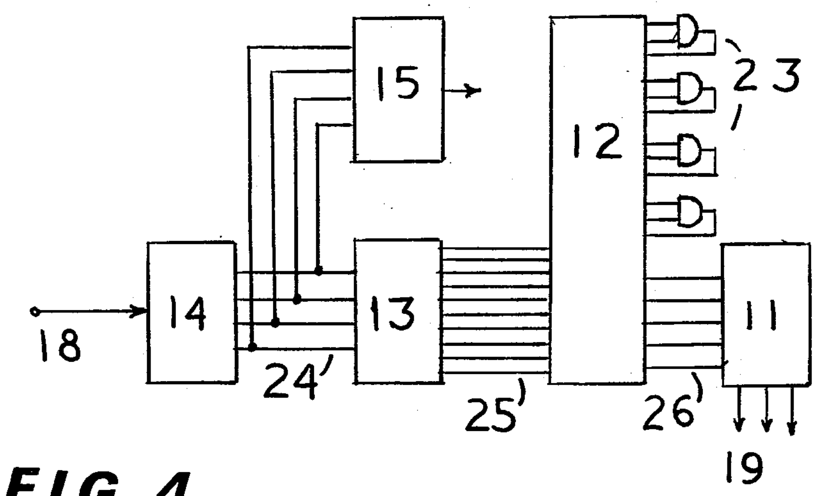
FIG. 4 is a block diagram of the year counter, prewired memory card and associated diodes for controlling varying months and the leap month.

In order to control the yearly varying characteristics of the calendar, a year counter shown in FIGS. 1 and 4 is used which is clocked through wire 18, the new month (Tisheri) output lead of the month shift register. The year counter BCD outputs are decoded by the BCD to decade decoder 13 and the diode matrix decoder 11 into the three outputs which control the length of Heshvan, Kislev and Adar I and determine when there is a leap month of Adar II. A prewired card 12 containing no electronics enables quick inexpensive memory changes for a new ten year period without changes in logic design by connecting the outputs of the BCD to decade decoder 13 to the diode matrix decoder inputs in a way to be described.

Figure 3:
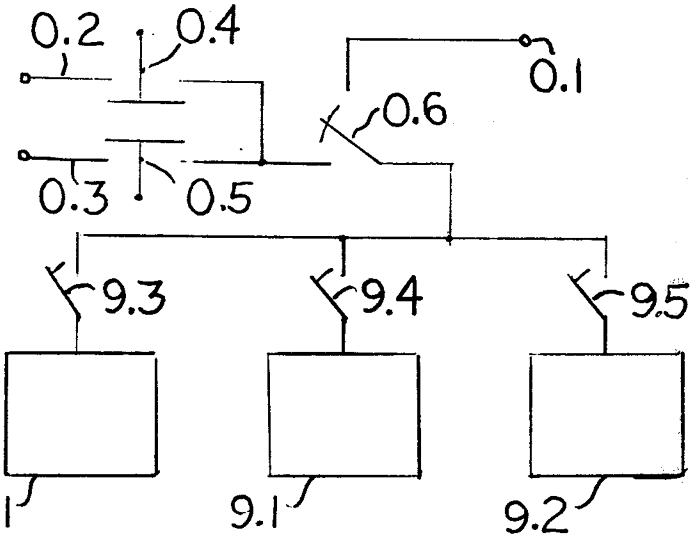
FIG. 3 is a schematic illustration of the switch configuration used in the set, operate and date computing modes.

The input source 0 to the device is a pulse train of one pulse pulse per day at input 0.1 or a variable pulse rate at input 0.3 for the set/compute mode (see FIGS. 1 and 3). These inputs are fed to the day of the month counter 1 of the Hebrew calendar, as well as to an electronic Gregorian calendar 9.1 and the day of the week register 9.2. Push-button switches (0.4) and 0.5 in FIG. 3 select the desired pulse rate for setting and computing, and SPDT switch 0.6 selects set-compute/operate modes. Switches 9.3, 9.4 and 9.5 connect the selected pulse input to the electronic Hebrew calendar, Gregorian calendar 9.1 and day of the week register 9.2, respectively.

Figure 5:
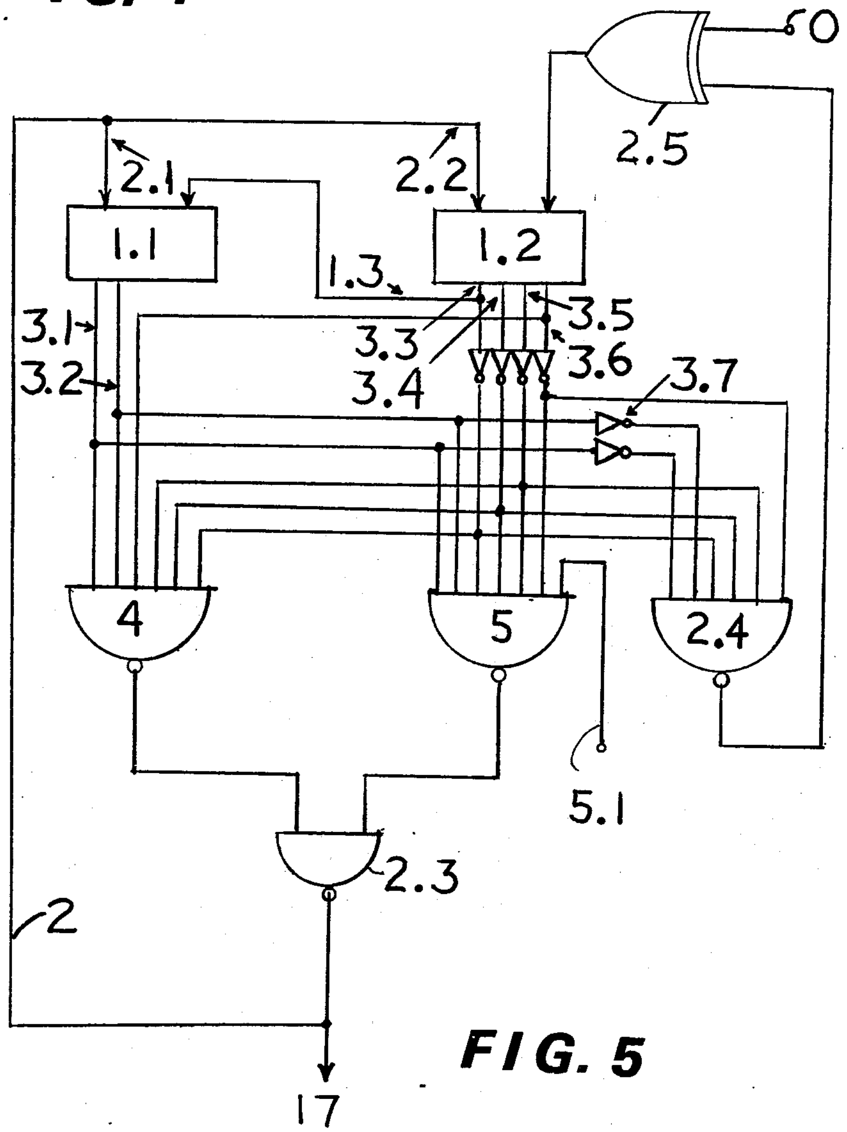
FIG. 5 is the logic diagram of the day of the month counter and controls.

The day of the month counter 1, shown in FIGS. 1 and 5, consists of two BCD or binary coded decimal decade counters, for the ten's digit 1.1 and for the one's digit 1.2. A carry connecting wire 1.3 connects the two counters. NAND gates 4 and 5 detect 31 and 30 counts respectively from the BCD counter 1 through inverters 3.7 and counter output wires 3.1, 3.2, 3.3, 3.4, 3.5 and 3.6. These output wires are also connected to a standard pair of 7 segment displays with BCD to 7 segment decoder logic. The details are not shown. The counter automatically resets on the count of 30 (29 is the highest number displayed) unless an inhibit input "L" is present on wire 5.1 of NAND gate 5. Note that wire 5.1 is also connected to the output of gate 8. When the inhibit input is present, the counter resets on the count of 31 (30 would be the highest number displayed). NAND gate 2.3 outputs a reset condition through wire 2 to ports 2.1 and 2.2 on the counter, when the required conditions are met either on gate 4 or 5. The output of the NAND gate 2.3 is connected both to the reset wire 2 and to the clock input of ports 17.1 and 17.2 of the month register 6. A reset of the day of the month counter 1 is accompanied by advance of the month shift register 6 indication. For BCD counters which cannot be made to reset to one rather than zero, a special automatic advance consisting of NAND gate 2.4 and exclusive OR gate 2.5 is used. When gate 2.4 detects a zero count of the counter it applies a "L" to the exclusive OR gate which advances the counter by one. The outputs 3 of the day of the month counter 1 are fed to standard BCD to seven segment decoders and seven segment numeral or other displays.

Figure 6:
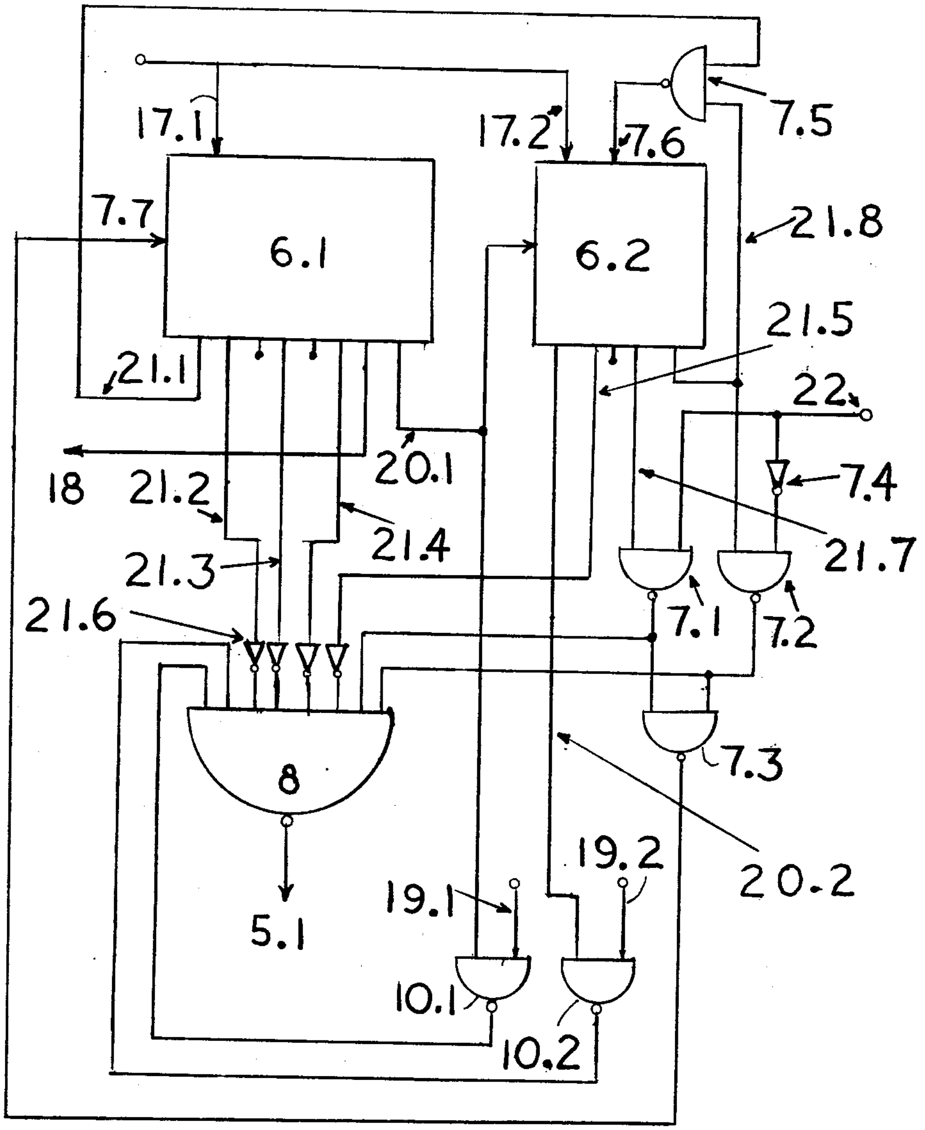
FIG. 6 is a logic diagram of the month shift register and associated controls.

Shown in FIGS. 1 and 6 is the month shift register 6, which consists of two parts, an 8 bit shift register 6.1 for the months Nisan, Iyar, Sivan, Tammuz, Av, Elul, Tishrei and Heshvan, and a 5 bit shift register 6.2 for the months Kislev, Tevet, Shevat, Adar I and Adar II. These two shift registers are serially connected by a wire 20.1 from the Heshvan output of the 8 bit shift register to the serial input of the 5 bit shift register. The output wires for the 29 day months, Iyar 21.2, Tammuz 21.3, Elul 21.4, Tevet 21.5 and Adar II 21.8 are connected to the input of a NAND gate 8 through a set of inverters 21.6 and NAND gate 7.2. When a 29 day month is indicated by the shift register, an "H" output of NAND gate 8 is applied to NAND gate 5 which is part of the day of the month counter logic through wire 5.1. This forces the day of the month counter 1 to reset through wire 2 after the 29th day of the month.

Shift register output wires for Heshvan 20.1 and Kislev 20.2 in FIG. 6 are applied to two NAND gates, 10.1 and 10.2, respectively. The presence of "H" inputs to gates 10.1 or 10.2 from the shift registers accompanied by corresponding "H" inputs through ports 19.1 or 19.2 from the diode matrix decoder 11 causes a "L" output from gate 10.1 or 10.2 to be applied to NAND gate 8. This treats Heshvan or Kislev as a 29 day month and causes the day of the month counter to reset after 29 days. On the other hand, if Heshvan or Kislev has 30 days in a given year, the input wire for Heshvan 19.1 or the input wire for Kislev 19.2 from the diode matrix decoder will be "L" thus causing Heshvan or Kislev to be treated as a 30 day month and resetting the day of the month counter after the 30th day of the month. In this way the counters and shift register can be controlled for these varying months. An "H" output from gate 8 can only occur if there is a fixed 29 day month indicated by the shift registers 6.1 and 6.2 or if the varying months of Heshvan, Kislev or Adar I are indicated and the diode matrix decoder gives an "H" output (indicating a 29 day month). Referring to FIGS. 1 and 6, the month indication is controlled by two serially connected shift registers 6.1 and 6.2. The set of gates 7.1, 7.2, 7.3, and 7.5 and inverter 7.4 function as the leap year control logic for the month indication shift registers. During a leap year, lead 22 has an "L" input which forces the output of NAND gate 7.1 to be an "H". NAND gate 7.2 has an "H" output until the thirteenth or leap month (Adar II) is displayed, when its output switches to "L", resulting in an "H" input to NAND gates 7.5 and 7.2 through lead 21.8. When this occurs, the output of NAND gate 7.2 goes to "L". This forces the output of NAND gate 7.3 to go an "H" state, serially entering a bit into shift register 6.1 through wire 7.7, causing indication of the next month after the leap month (Nisan).

At the same time, the output of NAND gate 7.5 goes to an "L" state, causing a reset through wire 7.6 of Shift register 6.2. In other words, NAND gate 7.5 does not allow simultaneous display of a bit in the last position of shift register 6.2 and the first position of shift register 6.1. It should be noted that the relative length of shift registers 6.1 and 6.2 is arbitrary, as long as the total number of shift positions capable of being handled is thirteen.

When the year in question is not a leap year, lead 22 is an "H" (high logic level) which causes an "H" output from gate 7.3 when the twelfth month is displayed (i.e., Adar I, the month prior to the leap month. This causes the same reset function of shift register 6.2 and serially enters a bit into shift register 6.1 for indication of the next month, (Nisan), through wire 7.7. Thus it is shown that this shift register implementation with appropriate gating simplifies the leap month tracking function. In addition, the arrangement whereby the shift registers 6.1 and 6.2 are arranged so that the leap month (Adar II) represents the last position of shift register 6.2 and the month directly after the leap month (Nisan) represents the first position of shift register 6.1 facilitates the month counting and display function.

When there is a leap year with the extra month of Adar II, there is also 30 days in the month of Adar I. In a leap year, control input wire (22) connecting to NAND gate 7.1 is an "L" which causes an additional "H" input to NAND gate 8 from NAND Gate 7.1. The outer input of NAND gate 7.1 comes from the Adar I lead 21.7 of shift register 6.2, treating Adar I as a 30 day month.

The year counter 14 shown in FIGS. 1 and 4 is a decade binary coded decimal (BCD) counter like the day counter 1. The year counter drives a BCD to seven segment decoder and display 15 along with a BCD to decade decoder 13. The 10 outputs 25 of the decoder 13 are normally in the "H" state and go to "L" to indicate a given digit. These outputs are connected by wires 12.1 inside the interchangeable prewired card 12. Four AND gates 23 are externally connected to the prewired card or chip 12 which has 5 output leads 26, for year types indicated in Tables II and III. Output lead 26.1 is for year type 1, 26.2 for year type 2, 26.3 for year type 3, 24.4 for year type 4 and 26.5 for year type 6, all shown in Table II and FIG. 7. Year type 5 is indicated by no "L" output from any line of the prewired card or chip 12, and therefore no prewired connection need be provided for this year type.

Figure 7:
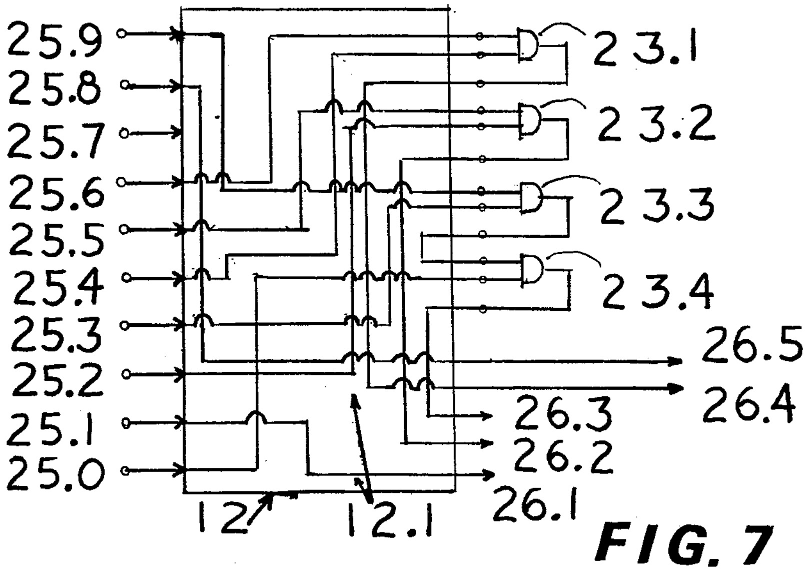
FIG. 7 is a schematic diagram showing the details of the prewined card or chips for the years 5736–5745.

The plug-in prewired card or chip 12 with detail shown in FIG. 7 is a means of providing an interchangeable memory element for the calendar without requiring the replacement of any electronic components. From Table III it should be noted that one of six year types must be selected for each year in the decade. The prewired card combines the year indication (those input leads indicated by 25.0 to 25.9 with the corresponding year type leads as its output 26.1 to 26.5. Each year lead 25 and year type lead 26 is normally in the "H" state and goes to "L" for indication. Since there are 10 years in the decade and only six year types, it is evident that more than one year in the ten may have the same year type. For the prewired card 12 shown in FIG. 7 covering the years 5736–5745 (1975–1985) the leads for years ending in 6 and 4 are wired to the year type 4 lead through AND gate 23.1, the lead for the year ending in 5 is wired to the year type 5 lead, the lead for the year ending in 8 is wired to the year type 6 lead, the leads for years ending in 9, 0 and 3 are wired through AND gates 23.3 and 23.4 to the year type 3 lead, the lead for the year ending in 1 is wired to year type 1 lead, and leads for years ending in 2 and 5 are wired to the year type 2 lead through AND gate 23.2. The four AND gates 23 can be wired in varying combinations of the year and year type based on a table like Table III to make the calendar useable for any 10 year period chosen.

The five outputs 26 of the prewired card or chip 12 are normally in the "H" state; the indications of a given year type are shown when the respective output goes to the "L" state. These outputs 26 are connected to the diode matrix decoder 11 having detail shown in FIG. 8, in order to give the required outputs for the months of Heshvan through wire 19.1, Kislev through wire 19.2, Adar I through wire 22 and the leap month through wire 22. The leap year wire 22 serves both for determining the number of days for Adar I and indicating whether there is a leap month Adar II, since both of these occur together. An "L" output from the output wires 19.1 or 19.2 indicates a 30-day month and an "L" at the output wire 22 of the diode matrix decoder indicates a leap year and 30 days in Adar I. The year counter is driven from the new year month wire 18 (Tishrei) of the month shift register 6. Table IV below shows the net relationship of the year counter output 24 to the output of the diode matrix decoder: wires 19.1, 19.2 and 22. (Refer also to FIGS. 4, 6, 7 and 8.) Chart Showing Decoding from Outputs of BCD Year Counter to Output of Diode Matrix Decoder (Table IV)

| Last Digit of Year | | BCD Representation-Year Counter Output | Outputs of Diode Matrix Decoder: Bit 1 Heshvan | Bit 2 Kislev | Bit 3 Adar I/Leap Year |
|---|---|---|---|---|---|
| | | For Ten Year Period 5736* – 5745 (1975–1985) | | | |
| - | (5740) | L L L L | L | L | H** |
| 1 | . | L L L H | H | H | L |
| 2 | . | L L H L | H | L | H |
| 3 | . | L L H H | L | L | H |
| 4 | . | L H L L | L | L | L |
| 5 - | (5745) | L H L H | H | L | H |
| 6 - | (5736)* | L H H L | L | L | L |
| 7 | . | L H H H | H | H | H |
| 8 | . | H L L L | H | L | L |
| 9 - | (5739) | H L L H | L | L | H |
| | | For Ten Year Period 5746–5755 (1985–1995) | | | |
| 0 - | (5750) | L L L L | L | L | H |
| 1 | . | L L L H | H | L | H |
| 2 | . | L L H L | L | L | L |
| 3 | . | L L H H | H | H | H |
| 4 | . | L H L L | L | L | H |
| 5 - | (5755) | L H L H | H | L | L |
| 6 - | (5746) | L H H L | H | H | L |
| 7 | . | L H H H | L | L | H |
| 8 | . | H L L L | H | L | H |
| 9 - | (5749) | H L L H | H | H | L |

**H indicates 29 days in Adar I and no leap year

Figure 8:
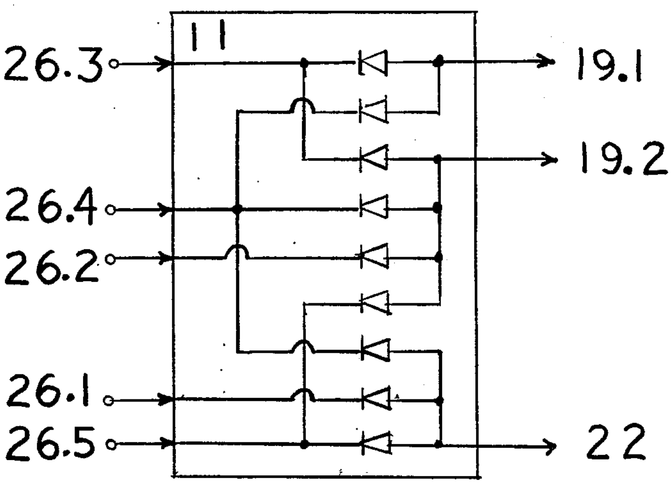
FIG. 8 is a schematic diagram showing the details of the diode matrix decoder, including the inputs and outputs.
Figure 9:
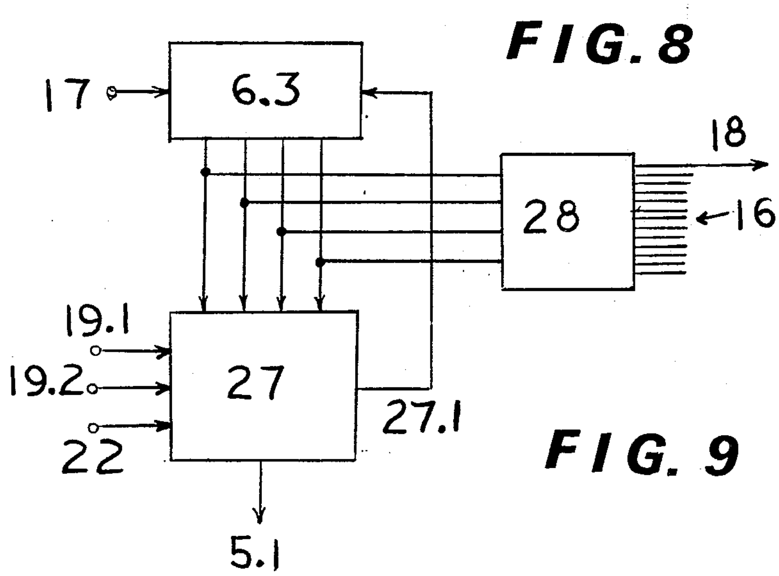
FIG. 9 is a simplified arrangement for the month register and associated logic employing a Read Only Memory (ROM).

It should be evident from examination of Table IV above and the foregoing discussion, that there six possible (valid) output combinations on leads 19.1, 19.2, and 22 of the diode matrix decoder. The first three columns depicted in the left hand portion of Table V show the six valid 3 bit combinations and associate each of them with a specified year type. FIGS. 8 and 9 show that leads 19.1, 19.2, and 22 from the output of the diode matrix decoder connect with the inputs depicted as the first three columns in Table V. (It may be noted that these three columns were taken from the first three rows of Table II, where the number 30 was associated with an "L" and the number 29 was associated with an "H" as discussed above.)

Referring to Table III which associates the year with its corresponding year type and Table V which associates the required three bit combination with each year type, one sees that table IV can easily be constructed for any desired period. (The corresponding table for any 10 year period results in the rearrangement of row elements of the last three columns, where certain row elements may be repeated.) The entries shown above can, therefore, be verified against the other tables in the Specification.

An alternate scheme for the month register and associated logic is shown in FIG. 9. In certain instances it may be desirable or more economically feasible to replace the gating elements and other logic associated with the month counter with a single Read Only Memory or ROM 27 and single 16 count BCD counter 6.3. FIG. 9 and Table V show the detail. The read only memory 27 in this configuration requires seven (address) inputs and two outputs. When considered as a "black box," output wire 5.1 of the read only memory shown in FIG. 9 is identical in function to the output wire 5.1 shown in FIG. 6. Output wire 27.1 of the ROM is the reset for the counter (reset condition is "H"). When the counter exceeds a 12 or 13 count, depending upon whether there is a leap year or not, reset occurs. ROM input wires 19.1, 19.2 and 22 in FIG. 9, indicating the nunber of days in Heshvan, Kislev and Adar I, and the leap year indication are equivalent to those shown in FIG. 6. The four BCD leads of the month counter are also inputs to the ROM. A BCD 4 wire to 16 wire decoder 28 is used in connection with the display 16 for the months. Wire 18 of the display for the month of Tishrei is used as before to drive the year counter 14. The storage characteristics of the Read Only Memory are given below in Table V with all required inputs and outputs shown.

Figure 2:
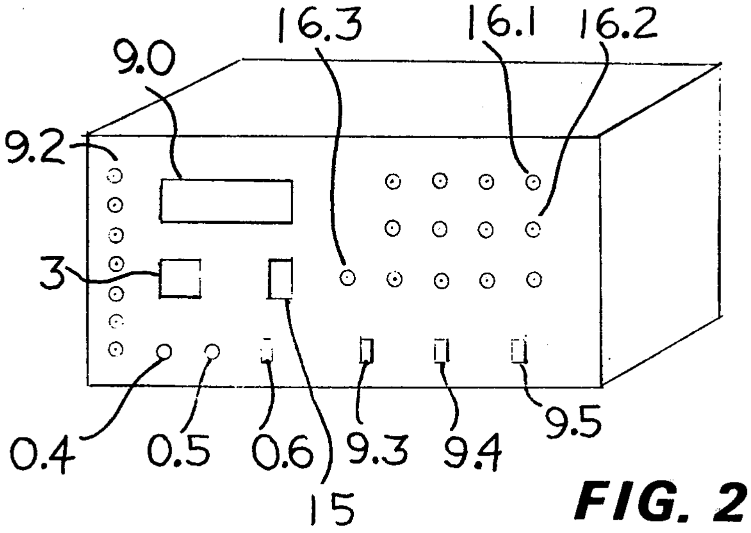
FIG. 2 is a pictorial drawing showing the layout and parts of the display, as well as the position of the various switches.

The display shown in FIG. 2 consists of two day-of-the-month seven segment LED display numerals 3, a single seven segment LED numeral 15 for the year indication, 13 LED month indicator lamps 16, with Nisan 16.1 at the upper right and Adar II 16.3 (leap month) at the lower left. Note also the position in the display for Iyar 16.2. All other months are sequenced in columns from right to left permitting the leap month to fall at the bottom left. In addition a display for the Gregorian Calendar 9.0 and the days of the week 9.2 are also shown. It is anticipated that other novel month displays could be used with this invention.

The device described can be used as shown in FIG. 3 to continuously display the Hebrew date by connecting the SPDT switch 0.6 to input source 0.1 and closing switch 9.3 which connects the 1 pulse per day input to the Hebrew calendar. Switches 9.4 and 9.5 can also be closed to connect the day of the week register and the Gregorian calendar to the 1 pulse per day input so that the simultaneous indication of the Hebrew and secular dates can be displayed along with the day of the week.

In the set mode, either push button switch 0.4 or 0.5 shown in FIG. 3 is closed connecting the desired input 0.2 1 pulse per second or 0.3 a higher variable pulse rate. Closing switch 9.3, 9.4 or 9.5 then sets the Hebrew calendar 1, Gregorian calendar 9.1 or the day of the week counter 9.2. After setting the two calendars and day of the week counter to a known date combination, corresponding future dates of the two calendars within the range of the Hebrew calendar can be computed (along with the corresponding day of the week) by connecting switch 0.6 to the fast or slow set inputs 0.1 or 0.2 and depressing push button switch 0.4 or 0.5.

While the invention has been particularly shown and described with reference to preferred embodiments thereof, it will be understood by those skilled in the art that various changes in form and details may be made therein without departing from the spirit and scope of the invention.

Table V

Month Counter Read Only Memory Contents

| | Inputs: | | | | | | | Outputs: | |
|---|---|---|---|---|---|---|---|---|---|
| | | | Leap | From Mo. Cntr. | | | | Month | 29/30 |
| | Heshvan | Kislev | Year | D | C | B | A | Reset | Days |
| Type 1 | | | | | | | | | |
| Nisan | H | H | L | L | L | L | L | L | L |
| Iyar | H | H | L | L | L | L | H | L | H |
| Sivan | H | H | L | L | L | H | L | L | L |
| Tammuz | H | H | L | L | L | H | H | L | H |
| Av | H | H | L | L | H | L | L | L | L |
| Elul | H | H | L | L | H | L | H | L | H |
| Tishrei | H | H | L | L | H | H | L | L | L |
| Heshvan | H | H | L | L | H | H | H | L | H |
| Kislev | H | H | L | H | L | L | L | L | H |
| Tevet | H | H | L | H | L | L | H | L | H |
| Shevat | H | H | L | H | L | H | L | L | L |
| Adar I | H | H | L | H | L | H | H | L | L |
| Adar II | H | H | L | H | H | L | L | L | H |
| — | H | H | L | H | H | L | H | H | x |
| Type 2 | | | | | | | | | |
| Nisan | H | L | H | L | L | L | L | L | L |
| Iyar | H | L | H | L | L | L | H | L | H |
| Sivan | H | L | H | L | L | H | L | L | L |
| Tammuz | H | L | H | L | L | H | H | L | H |
| Av | H | L | H | L | H | L | L | L | L |
| Elul | H | L | H | L | H | L | H | L | H |
| Tishrei | H | L | H | L | H | H | L | L | L |
| Heshvan | H | L | H | L | H | H | H | L | H |
| Kislev | H | L | H | H | L | L | L | L | L |
| Tevet | H | L | H | H | L | L | H | L | H |
| Shevat | H | L | H | H | L | H | L | L | L |
| Adar I | H | L | H | H | L | H | H | L | H |
| Adar II | L | L | H | H | H | L | L | H | x |
| Type 3 | | | | | | | | | |
| Nisan | L | L | H | L | L | L | L | L | L |
| Iyar | L | L | H | L | L | L | H | L | H |
| Sivan | L | L | H | L | L | H | L | L | L |
| Tammuz | L | L | H | L | L | H | H | L | H |
| Av | L | L | H | L | H | L | L | L | L |
| Elul | L | L | H | L | H | L | H | L | H |
| Tishrei | L | L | H | L | H | H | L | L | L |
| Heshvan | L | L | H | L | H | H | H | L | L |
| Kislev | L | L | H | H | L | L | L | L | L |
| Tevet | L | L | H | H | L | L | H | L | H |
| Shevat | L | L | H | H | L | H | L | L | L |

Table V-continued

| Month Counter Read Only Memory Contents | | | | | | | | | |
|---|---|---|---|---|---|---|---|---|---|
| | Inputs: | | | | | | | Outputs: | |
| | | | Leap | From Mo. Cntr. | | | | Month | 29/30 |
| | Heshvan | Kislev | Year | D | C | B | A | Reset | Days |
| Adar I | L | L | H | H | L | H | H | L | H |
| Adar II | L | L | H | H | H | L | L | H | x |
| Type 4 | | | | | | | | | |
| Nisan | L | L | L | L | L | L | L | L | L |
| Iyar | L | L | L | L | L | L | H | L | H |
| Sivan | L | L | L | L | L | H | L | L | L |
| Tammuz | L | L | L | L | L | H | H | L | H |
| Av | L | L | L | L | H | L | L | L | L |
| Elul | L | L | L | L | H | L | H | L | H |
| Tishrei | L | L | L | L | H | H | L | L | L |
| Heshvan | L | L | L | L | H | H | H | L | L |
| Kislev | L | L | L | H | L | L | L | L | L |
| Tevet | L | L | L | H | L | L | H | L | H |
| Shevat | L | L | L | H | L | H | L | L | L |
| Adar I | L | L | L | H | L | H | H | L | L |
| Adar II | L | L | L | H | H | L | L | L | H |
| — | L | L | L | H | H | L | H | H | x |
| Type 5 | | | | | | | | | |
| Nisan | H | H | H | L | L | L | L | L | L |
| Iyar | H | H | H | L | L | L | H | L | H |
| Sivan | H | H | H | L | L | H | L | L | L |
| Tammuz | H | H | H | L | L | H | H | L | H |
| Av | H | H | H | L | H | L | L | L | L |
| Elul | H | H | H | L | H | L | H | L | H |
| Tishrei | H | H | H | L | H | H | L | L | L |
| Heshvan | H | H | H | L | H | H | H | L | H |
| Kislev | H | H | H | H | L | L | L | L | H |
| Tevet | H | H | H | H | L | L | H | L | H |
| Shevat | H | H | H | H | L | H | L | L | L |
| Adar I | H | H | H | H | L | H | H | L | H |
| Adar II | H | H | H | H | H | L | L | H | x |
| Type 6 | | | | | | | | | |
| Nisan | H | L | L | L | L | L | L | L | L |
| Iyar | H | L | L | L | L | L | H | L | H |
| Sivan | H | L | L | L | L | H | L | L | L |
| Tammuz | H | L | L | L | L | H | H | L | H |
| Av | H | L | L | L | H | L | L | L | L |
| Elul | H | L | L | L | H | L | H | L | H |
| Tishrei | H | L | L | L | H | H | L | L | L |
| Heshvan | H | L | L | L | H | H | H | L | H |
| Kislev | H | L | L | H | L | L | L | L | L |
| Tevet | H | L | L | H | L | L | H | L | H |
| Shevat | H | L | L | H | L | H | L | L | L |
| Adar I | H | L | L | H | L | H | H | L | L |
| Adar II | H | L | L | H | H | L | L | L | H |
| — | H | L | L | H | H | L | H | H | x |

x don't care
H high logic level
L low logic level

What I claim is:

1. A self-contained electronic device capable of accurately tracking and displaying the month, day and year of the Hebrew calendar, in the presence of all regular and subtle irregular yearly variations in several of its months over any multiple year period comprising: a month counting and displaying means for indicating twelve calendar months plus a thirteenth leap month, a day counting means for displaying the day of the month and resettable to one after a count of thirty days, except when an external input is present which causes it to reset after twenty-nine days, a day gating means which provides a logic signal to the day counting means causing it to reset for twenty-nine day months, a year counting means for counting and displaying the last digit of the calendar year, a memory means which takes the output of the year counting means and decodes it into outputs which determine the length of yearly varying months and control for the presence of a leap month, a connecting means which provides an appropriate reset condition to the day counter through the day gating means when twenty-nine day months are indicated by the month counter, a connecting means for advancing the month counter when the day counter is reset, a connecting means between the memory means and day gating means to control the day counter for months which vary between twenty-nine and thirty days, and a connecting means between the memory and month counting means to allow the month counting means to count to thirteen for leap years and to twelve for regular years.

2. The device described in claim one wherein the day counting means comprises: two serially connected binary coded decimal counting means with input means, a 30 count detector gating means, a 31 count detector gating means, and a connecting means to normally reset the counter to one through a wire from the output of said gating means to the counter reset input on a count of 31, resulting in the highest counter indication of 30, unless a high logic level is present on the 30 count detector gating means, and in such cases to reset to one on a count of 30, resulting in the highest counter indication of 29.

3. The device described in claim one wherein the month counting means comprises: a serially connected common clocked eight bit and five bit shift register means, a display means connected to the outputs of the shift register means, a 29 day month gating means whose output indicates when a 29 day month is displayed and whose inputs are taken from the 29 day month or varying month outputs, a leap month gating means for resetting the five bit shift register after the leap month or the month prior to the leap month is displayed (depending upon an external input), a gating means for serially entering a bit into the eight bit shift register when the five bit register is reset, gating means allowing for external inputs indicating which months whose year to year length varies have 29 days, a clocking means driven by the reset pulse from the day counting means for shifting a single bit through the shift registers, an input means for indicating which varying months have 29 days in a given year and for indicating leap years to the leap month gating means, and an output means from the 29 month gating means to indicate a reset condition after 29 days to the day counting means.

4. The device described in claim one further including switching means which connects a Gregorian calendar means, a day of the week counting means, and the Hebrew calendar device to a common bus which is connected by a second SPDT switching means to one pulse per day inputs and a variable pulse rate input controlled by a push-button switch, so as to enable the individual setting and simultaneous operation of said calendars and to enable the computation of future Gregorian/Hebrew date configurations and associated days of the week from a known date/day of the week combination by simultaneously driving the calendars with the selected input pulse rate to a desired date from the initial date combination setting.

5. The device described in claim one wherein a single replaceable prewired connecting means connects year leads decoded from a binary year counting means by a decoding means, and external gates to year type leads, where external gates are used to combine multiple year leads into a single output lead when more than one year is specified by the same year type, as prescribed by a portion of the following table for the period 5736–5571 (1975 to 2011):

| Identified Year Leads | Year Type Leads | # Days in Year | Year in Leap Year Cycle |
|---|---|---|---|
| 5736 (1975-6) | 4 | 385* | 17 |
| 5737 (1976-7 | 5 | 353 | 18 |
| 5738 | 6 | 384* | 19 |
| 5739 | 3 | 355 | 1 |
| 5740 | 3 | 355 | 2 |
| 5741 | 1 | 383* | 3 |
| 5742 | 2 | 354 | 4 |
| 5743 | 3 | 355 | 5 |
| 5744 | 4 | 385* | 6 |
| 5745 | 2 | 354 | 7 |
| 5746 | 1 | 383* | 8 |
| 5747 | 3 | 355 | 9 |
| 5748 | 2 | 354 | 10 |
| 5749 | 1 | 383* | 11 |
| 5750 | 3 | 355 | 12 |
| 5751 | 2 | 354 | 13 |
| 5752 | 4 | 385* | 14 |
| 5753 | 5 | 353 | 15 |
| 5754 | 3 | 355 | 16 |
| 5755 | 6 | 384* | 17 |
| 5756 | 3 | 355 | 18 |

-continued

| Identified Year Leads | Year Type Leads | # Days in Year | Year in Leap Year Cycle |
|---|---|---|---|
| 5757 | 1 | 383* | 19 |
| 5758 | 2 | 354 | 1 |
| 5759 | 3 | 355 | 2 |
| 5760 | 4 | 385* | 3 |
| 5761 | 5 | 353 | 4 |
| 5762 | 2 | 354 | 5 |
| 5763 | 4 | 385* | 6 |
| 5764 | 3 | 355 | 7 |
| 5765 | 1 | 383* | 8 |
| 5766 | 2 | 354 | 9 |
| 5767 | 3 | 355 | 10 |
| 5768 | 1 | 383* | 11 |
| 5769 | 2 | 354 | 12 |
| 5770 | 3 | 355 | 13 |
| 5771 (2010-2011) | 4 | 385* | 14 |

*Leap years

6. The device described in claim one wherein the memory means further includes a diode decoding matrix means consisting of diodes serving as gating elements decoding six year type inputs into three outputs which indicate whether the varying months of Adar I, Heshvan and Kislev have 29 or 30 days in a given year and whether there is a leap month, a connecting means which connects output one for Heshvan's length to the anode of diodes one and two, output two for Kislev's length to the anodes of diodes three, four, five and six, output three for Adar I's length and the leap month to the anodes of diodes seven, eight and nine, the year type one input to the cathode of diode seven, the year type two input to the cathode of diode five, the year type three input to the cathodes of diodes one and three, the year type four input to the cathode of diodes two, four and seven, and the year type five input to the cathodes of diodes six and nine, wherein the year types referred to are defined below:

| | Year Types and Varying Months' Length | | | | | |
|---|---|---|---|---|---|---|
| Yr. type | 1 | 2 | 3 | 4 | 5 | 6 |
| HESHVAN | 29 | 29 | 30 | 30 | 29 | 29 |
| KISLEV | 29 | 30 | 30 | 30 | 29 | 30 |
| ADAR I | 30 | 29 | 29 | 30 | 29 | 30 |
| ADAR II | 29 | — | — | 29 | — | 29 |
| Total days in Year | 383 | 354 | 355 | 385 | 353 | 384 |

7. The device described in claim one wherein the memory means, consisting of an electronic decoder, converts a binary output from a Binary Coded Decimal (BCD) year counter to a three bit binary output as shown in the Table below with the Letters H and L indicating binary logic levels, where bit one indicates whether Heshvan has 29 days signified by the Letter H or 30 days signified by the Letter L, bit two similarly indicates whether Kislev has 29 or 30 days, and bit three similarly indicates whether Adar I has 29 days with no leap month added or 30 days with the leap month Adar II added.

| For Ten Year Period 5736* - 5745 (1975-1985) | | | | |
|---|---|---|---|---|
| Inputs to decoder | | Outputs of Decoder | | |
| Last Digit of Year | (Year Counter Output) | Bit 1 Heshvan | Bit 2 Kislev | Bit 3 Adar I/Leap Year |
| 0 - (5740) | L L L L | L | L | H |
| 1 . | L L L H | H | H | L |
| 2 . | L L H L | H | L | H |
| 3 . | L L H H | L | L | H |
| 4 | L H L L | L | L | L |
| 5 - (5745) | L H L H | H | L | H |
| 6 - (5736)* | L H H L | L | L | L |
| 7 . | L H H H | H | H | H |

-continued

| | | | | | |
|---|---|---|---|---|---|
| For Ten Year Period 5736* - 5745 (1975-1985) | | | | | |
| Inputs to decoder | | | Outputs of Decoder | | |
| Last Digit of Year | | (Year Counter Output) | Bit 1 Heshvan | Bit 2 Kislev | Bit 3 Adar I/Leap Year |
| 8 | . | H L L L | H | L | L |
| 9 - | (5739) | H L L H | L | L | H |
| For Ten Year Period 5746-5755 (1985-1995) | | | | | |
| 0 - | (5750) | L L L L | L | L | H |
| 1 | . | L L L H | H | L | H |
| 2 | . | L L H L | L | L | L |
| 3 | . | L L H H | H | H | H |
| 4 | | L H L L | L | L | H |
| 5 - | (5755) | L H L H | H | L | L |
| 6 - | (5746) | L H H L | H | H | L |
| 7 | . | L H H H | L | L | H |
| 8 | . | H L L L | H | L | H |
| 9 - | (5749) | H L L H | H | H | L |

8. The device described in claim one above further including a Read Only Memory (ROM) means with coding scheme depicted in the table below with the letters H and L signifying binary logic levels, to convert four bit binary input from a four bit binary month counter means along with three inputs, which indicate whether the months Heshvan, Kislev and Adar I have 29 days signified by the Letter H or 30 days signified by the Letter L, and whether there is a leap year, to two outputs which provide a reset to the month counter means and indicate whether the day of the month counter is to count to 29 days signified by the Letter H or 30 days signified by the Letter L, before resetting.

| | Read Only Memory Inputs: | | | | | | | Outputs: | |
|---|---|---|---|---|---|---|---|---|---|
| | | | | From binary month Counter means | | | | | |
| | Heshvan | Kislev | Leap Year | D | C | B | A | Month Counter Reset Control | 29/30 Day of Month Counter Control |
| Type 1 | | | | | | | | | |
| Nisan | H | H | L | L | L | L | L | L | L |
| Iyar | H | H | L | L | L | L | H | L | H |
| Sivan | H | H | L | L | L | H | L | L | L |
| Tammuz | H | H | L | L | L | H | H | L | H |
| Av | H | H | L | L | H | L | L | L | L |
| Elul | H | H | L | L | H | L | H | L | H |
| Tishrei | H | H | L | L | H | H | L | L | L |
| Heshvan | H | H | L | L | H | H | H | L | H |
| Kislev | H | H | L | H | L | L | L | L | H |
| Tevet | H | H | L | H | L | L | H | L | H |
| Shevat | H | H | L | H | L | H | L | L | L |
| Adar I | H | H | L | H | L | H | H | L | L |
| Adar II | H | H | L | H | H | L | L | L | H |
| — | H | H | L | H | H | L | H | H (reset) | H or L |
| Type 2 | | | | | | | | | |
| Nisan | H | L | H | L | L | L | L | L | L |
| Iyar | H | L | H | L | L | L | H | L | H |
| Sivan | H | L | H | L | L | H | L | L | L |
| Tammuz | H | L | H | L | L | H | H | L | H |
| Av | H | L | H | L | H | L | L | L | L |
| Elul | H | L | H | L | H | L | H | L | H |
| Tishrei | H | L | H | L | H | H | L | L | L |
| Heshvan | H | L | H | L | H | H | H | L | H |
| Kislev | H | L | H | H | L | L | L | L | L |
| Tevet | H | L | H | H | L | L | H | L | H |
| Shevat | H | L | H | H | L | H | L | L | L |
| Adar I | H | L | H | H | L | H | H | L | H |
| Adar II | H | L | H | H | H | L | L | H (reset) | H or L |
| Type 3 | | | | | | | | | |
| Nisan | L | L | H | L | L | L | L | L | L |
| Iyar | L | L | H | L | L | L | H | L | H |
| Sivan | L | L | H | L | L | H | L | L | L |
| Tammuz | L | L | H | L | L | H | H | L | H |
| Av | L | L | H | L | H | L | L | L | L |
| Elul | L | L | H | L | H | L | H | L | H |
| Tishrei | L | L | H | L | H | H | L | L | L |
| Heshvan | L | L | H | L | H | H | H | L | L |
| Kislev | L | L | H | H | L | L | L | L | L |
| Tevet | L | L | H | H | L | L | H | L | H |
| Shevat | L | L | H | H | L | H | L | L | L |
| Adar I | L | L | H | H | L | H | H | L | H |
| Adar II | L | L | H | H | H | L | L | H (reset) | H or L |
| Type 4 | | | | | | | | | |
| Nisan | L | L | L | L | L | L | L | L | L |
| Iyar | L | L | L | L | L | L | H | L | H |
| Sivan | L | L | L | L | L | H | L | L | L |
| Tammuz | L | L | L | L | L | H | H | L | H |
| Av | L | L | L | L | H | L | L | L | L |
| Elul | L | L | L | L | H | L | H | L | H |
| Tishrei | L | L | L | L | H | H | L | L | L |
| Heshvan | L | L | L | L | H | H | H | L | L |
| Kislev | L | L | L | H | L | L | L | L | L |
| Tevet | L | L | L | H | L | L | H | L | H |
| Shevat | L | L | L | H | L | H | L | L | L |
| Adar I | L | L | L | H | L | H | H | L | L |

-continued

| | Read Only Memory Inputs: | | | | | | | Outputs: | |
|---|---|---|---|---|---|---|---|---|---|
| | | | Leap | From binary month Counter means | | | | Month Counter | 29/30 Day of Month Counter |
| | Heshvan | Kislev | Year | D | C | B | A | Reset Control | Control |
| Adar II | L | L | L | H | H | L | L | L | H |
| — | L | L | L | H | H | L | H | H (reset) | H or L |
| Type 5 | | | | | | | | | |
| Nisan | H | H | H | L | L | L | L | L | L |
| Iyar | H | H | H | L | L | L | H | L | H |
| Sivan | H | H | H | L | L | H | L | L | L |
| Tammuz | H | H | H | L | L | H | H | L | H |
| Av | H | H | H | L | H | L | L | L | L |
| Elul | H | H | H | L | H | L | H | L | H |
| Tishrei | H | H | H | L | H | H | L | L | L |
| Heshvan | H | H | H | L | H | H | H | L | H |
| Kislev | H | H | H | H | L | L | L | L | H |
| Tevet | H | H | H | H | L | L | H | L | H |
| Shevat | H | H | H | H | L | H | L | L | L |
| Adar I | H | H | H | H | L | H | H | L | H |
| Adar II | H | H | H | H | H | L | L | H (reset) | H or L |
| Type 6 | | | | | | | | | |
| Nisan | H | L | L | L | L | L | L | L | L |
| Iyar | H | L | L | L | L | L | H | L | H |
| Sivan | H | L | L | L | L | H | L | L | L |
| Tammuz | H | L | L | L | L | H | H | L | H |
| Av | H | L | L | L | H | L | L | L | L |
| Elul | H | L | L | L | H | L | H | L | H |
| Tishrei | H | L | L | L | H | H | L | L | L |
| Heshvan | H | L | L | L | H | H | H | L | H |
| Kislev | H | L | L | H | L | L | L | L | L |
| Tevet | H | L | L | H | L | L | H | L | H |
| Shevat | H | L | L | H | L | H | L | L | L |
| Adar I | H | L | L | H | L | H | H | L | L |
| Adar II | H | L | L | H | H | L | L | L | H |
| — | H | L | L | H | H | L | H | H (reset) | H or L |

9. The device described in claim 1, wherein the month counting means comprises: a programmable counting means allowing either 12 or 13 calendar months to be counted and displayed before resetting, an input means for selecting between the two counting modes, an input means for accepting pulses to be counted, and a memory means, whose address leads are connected to the outputs of the programmable counting means by a connecting means and which decodes the outputs of the programmable counting means into a high or low logic output where one logic level denotes that a 29 day month is indicated in the programmable counting means and the other logic level denotes that a 30 day month is indicated in the programmable counting means.

10. The device described in claim one wherein the year counting means counts and displays more than one digit of the calendar year and the memory means takes the output of the year counting means and decodes it into three outputs which determine the length of yearly varying months a control for the presence of a leap month in order that the device can track calendar variations for a continuous period greater than ten years.

11. A prewired replaceable memory means used in an electronic calendar device to control calendar counting and display means in the presence of counting irregularities, capable of associating binary inputs with programmed binary outputs and easily changed by the rewiring of a replaceable unit which need not contain electronic or other components besides wired connections comprising: binary counter means, representing the calendar year, connected to binary to multiple line decoder/demultiplexer means whose outputs are all normally at a single logic state and change their logical state individually to indicate the state of a portion of the binary counter means; a set of Gates functioning as a grouping means, connected by a prewired replaceable connecting means so that each lead or set of leads from the binary to multiple line decoder/demultiplexer means is wired to a separate terminal, representing a year type, where the Gates which can be placed external to the replaceable prewired means are used when more than none lead of the binary to multiple line decoder means is to connect to the same terminal; and an output decoder means, whose inputs are connected to said terminals, which decodes the terminals of the prewired replaceable connecting means into a set of output leads such that a changed logic state on any individual terminal results in a separate binary code on the output leads to control the leap month conditions of a month counter means, the reset conditions of a day of the month counter meaning for months whose length varies from year to year in response to yearly calendar variations, and display means, with gates, counters and decoders as separate permanent units, so that removal of the prewired means does not require removal of any electronic components.

12. The device described in claim 11, wherein the inputs to the binary to multiple lead decoder demultiplexer means are driven by month and day counter means, where outputs of the replaceable prewired memory means provide reset inputs to day counter means, reset condition to month counter means for months whose length is fixed in a given year, and inputs to display means.

* * * * *